United States Patent
Gorman

(10) Patent No.: US 9,093,987 B1
(45) Date of Patent: Jul. 28, 2015

(54) DIFFERENTIAL LEVEL SHIFTER FOR IMPROVING COMMON MODE REJECTION RATIO

(71) Applicant: Xilinx, Inc., San Jose, CA (US)

(72) Inventor: Christopher M. Gorman, Galway (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 13/630,486

(22) Filed: Sep. 28, 2012

(51) Int. Cl.
*H03L 5/00* (2006.01)
*H03K 3/012* (2006.01)

(52) U.S. Cl.
CPC ....................................... *H03K 3/012* (2013.01)

(58) Field of Classification Search
None
See application file for complete search history.

(56) References Cited

U.S. PATENT DOCUMENTS

| | | | | |
|---|---|---|---|---|
| 5,355,391 A * | 10/1994 | Horowitz et al. | ............. | 375/257 |
| 6,150,843 A * | 11/2000 | Shiffer et al. | ................... | 326/80 |
| 6,396,329 B1 * | 5/2002 | Zerbe | ............................. | 327/336 |
| 6,639,427 B2 * | 10/2003 | Dray et al. | ....................... | 326/83 |
| 6,870,404 B1 * | 3/2005 | Maangat | ......................... | 327/65 |
| 7,463,078 B2 * | 12/2008 | Xu | ................. | 327/333 |
| 7,468,616 B1 * | 12/2008 | Kondapalli et al. | ............. | 326/82 |
| 8,400,211 B2 * | 3/2013 | Chen | ............................. | 327/535 |
| 8,436,656 B2 * | 5/2013 | Gitlin et al. | ..................... | 326/80 |
| 8,441,870 B2 * | 5/2013 | Kim | ............................. | 365/193 |
| 8,471,601 B2 * | 6/2013 | Meninger | .................... | 327/108 |
| 2009/0309647 A1 * | 12/2009 | Lim et al. | ...................... | 327/437 |

* cited by examiner

*Primary Examiner* — Lincoln Donovan
*Assistant Examiner* — Khareem E Almo
(74) *Attorney, Agent, or Firm* — Gerald Chan

(57) ABSTRACT

A differential level shifter includes: a first PMOS transistor, wherein a source/drain of the first PMOS transistor is coupled to a first CMOS signal, a gate of the first PMOS transistor is coupled to ground, and another source/drain of the first PMOS transistor is coupled to a first output node; a second PMOS transistor, wherein a source/drain of the second PMOS transistor is coupled to a second CMOS signal, a gate of the second PMOS transistor is coupled to ground, and another source/drain of the second PMOS transistor is coupled to a second output node; and a shift component coupled between the first output node and the second output node.

16 Claims, 7 Drawing Sheets

DIFFERENTIAL LEVEL SHIFTER FOR IMPROVING COMMON MODE REJECTION RATIO

FIELD OF THE APPLICATION

An embodiment relates generally to differential level shifters, and in particular to a differential level shifter for improving common mode noise.

BACKGROUND

Integrated circuits include various components that operate in different logic domains. These logic domains may include a complementary metal-oxide-semiconductor (CMOS) domain and a current mode logic (CML) domain. Often times, signals operating in one logic domain may be passed on to components operating in a different logic domain. Timing differences between signals operating in one logic domain may lead the introduction of unwanted noise when those signals are passed to a component operating in a different logic domain.

Differential signals generated in the CMOS domain are not generated from the same source, whereas differential signals generated in the CML domain are generated from the same source. Differential signals generated in the CMOS domain are two signals that are the inverse of each other, but do not originate from the same source. As such, these differential signals generated in the CMOS domain suffer from timing mismatches that result in a common mode signal that includes noise. Additionally, the signal swing in the CMOS domain is greater than that in the CML domain. Thus, if the inverted CMOS signals are directly connected to a component operating in the CML domain, a higher input signal swing is provided to the component operating in the CML domain than necessary. This in turn will lead to a greater amount of common mode noise being injected into the power supply of the component operating in the CML domain than desirable.

SUMMARY

In accordance with one embodiment, a differential level shifter includes: a first PMOS transistor, wherein a source/drain of the first PMOS transistor is coupled to a first CMOS signal, a gate of the first PMOS transistor is coupled to ground, and another source/drain of the first PMOS transistor is coupled to a first output node; a second PMOS transistor, wherein a source/drain of the second PMOS transistor is coupled to a second CMOS signal, a gate of the second PMOS transistor is coupled to ground, and another source/drain of the second PMOS transistor is coupled to a second output node; and a shift component coupled between the first output node and the second output node.

In accordance with another embodiment, a differential level shifter includes: a first NMOS transistor, wherein a source/drain of the first NMOS transistor is coupled to a first CMOS signal, a gate of the first NMOS transistor is coupled to a power supply, and another source/drain of the first NMOS transistor is coupled to a first output node; a second NMOS transistor, wherein a source/drain of the second NMOS transistor is coupled to a second CMOS signal, a gate of the second NMOS transistor is coupled to the power supply, and another source/drain of the second NMOS transistor is coupled to a second output node; and a shift component coupled between the first output node and the second output node.

In accordance with yet another embodiment, a method for reducing noise associated with a common mode signal includes: receiving a first CMOS signal at an input of a first MOS transistor; receiving a second CMOS signal at an input of a second MOS transistor; reducing a first signal swing associated with the first CMOS signal to provide a first output signal at an output of the first MOS transistor by utilizing a first voltage divider formed by the first MOS transistor and a shift component coupled to the output of the first MOS transistor; and reducing a second signal swing associated with the second CMOS signal to provide a second output signal at an output of the second MOS transistor by utilizing a second voltage divider formed by the second MOS transistor and the shift component, wherein the shift component is coupled to the output of the second MOS transistor.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

DETAILED DESCRIPTION

Figure 1:
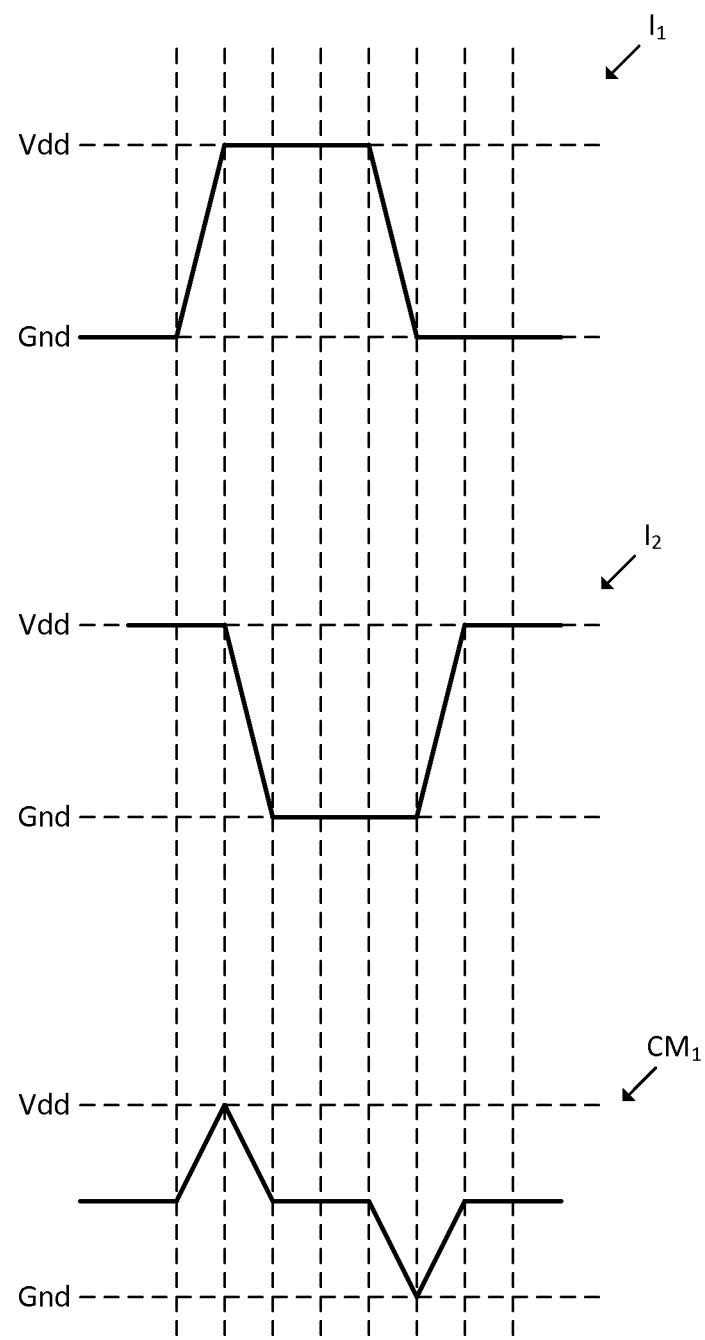
FIG. 1 illustrates a pair of CMOS logic signals and their common mode signal according to some embodiments.

Various embodiments are described hereinafter with reference to the figures. It should be noted that the figures are not necessarily drawn to scale and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated, or not so explicitly described. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiment" in various places throughout this specification are not necessarily referring to the same embodiment or embodiments.

Integrated circuits include various components that operate in different logic domains. These logic domains may include a complementary metal-oxide-semiconductor (CMOS) domain and a current mode logic (CML) domain. Often times, signals operating in one logic domain may be passed on to components operating in a different logic domain. Timing differences between signals operating in one logic domain may lead to the introduction of unwanted noise when those signals are passed to a component operating in a different logic domain.

Differential signals generated in the CMOS domain are not generated from the same source, whereas differential signals generated in the CML domain are generated from the same source. Differential signals are generated in the CMOS domain by inverting one signal to generate the pair of differential signals. As such, these differential signals generated in the CMOS domain suffer from timing mismatches that result in a common mode signal that includes noise. Additionally, the signal swing in the CMOS domain is greater than that in the CML domain. Thus, if the inverted CMOS signals (i.e., pair of differential signals) are directly connected to a component operating in the CML domain, a higher input signal swing is provided to the component operating in the CML domain than necessary. This in turn will lead to a greater amount of common mode noise being injected into the power supply of the component operating in the CML domain than desirable.

FIG. 1 illustrates a pair of differential signals $I_1$, $I_2$ and the common mode signal $CM_1$ that results from combining the pair of differential signals $I_1$, $I_2$. The pair of differential signals $I_1$, $I_2$ comprises a first CMOS logic signal $I_1$ and a second CMOS logic signal $I_2$. A CMOS logic signal (e.g., the first CMOS logic signal $I_1$, or the second CMOS logic signal $I_2$) may be considered an example of a CMOS signal. In some embodiments, the first CMOS logic signal $I_1$ may be a positive CMOS logic signal and the second CMOS logic signal $I_2$ may be a negative CMOS logic signal. For purposes of example, the first CMOS logic signal $I_1$ will be a positive CMOS logic signal and the second CMOS logic signal $I_2$ will be a negative CMOS logic signal for the remainder of the description. However, one ordinarily skilled in the art will recognize that various other combinations of the first CMOS logic signal $I_1$ and the second CMOS logic signal $I_2$ may be used.

The second CMOS logic signal $I_2$ is not generated by the same source that generates the first CMOS logic signal $I_1$, but is instead generated by inverting the first CMOS logic signal $I_1$. Because the second CMOS logic signal $I_2$ is generated by inverting the first CMOS logic signal $I_1$ rather than being generated by the same source as the first CMOS logic signal $I_1$, timing differences between the first CMOS logic signal $I_1$ and the second CMOS logic signal $I_2$ arise. This is illustrated in FIG. 1, where the first CMOS logic $I_1$ signal and the second CMOS logic signal $I_2$ do not exactly mirror each other.

Because the first CMOS logic signal $I_1$ and the second CMOS logic signal $I_2$ suffer from timing differences, a common mode signal $CM_1$ that suffers from noise is generated when the first CMOS logic signal $I_1$ and the second CMOS logic signal $I_2$ are combined. The amount of noise associated with the common mode signal $CM_1$ is compounded by the high signal swing of the CMOS logic signals $I_1$, $I_2$. The high signal swing of the CMOS logic signals $I_1$, $I_2$ refers to the range of voltages (e.g., Gnd to Vdd) associated with the CMOS logic signals $I_1$, $I_2$. Because the first CMOS logic signal $I_1$ and the second CMOS logic signal $I_2$ have a signal swing that utilizes the full range from ground Gnd to a power supply Vdd, the amount of noise associated with the common mode signal $CM_1$ due to timing differences is amplified.

Signals operating in the CML domain require a smaller signal swing than signals operating in the CMOS domain. As such, directly connecting the first CMOS logic signal $I_1$ and the second CMOS logic signal $I_2$ to a component operating in the CML domain would introduce an unnecessary amount of noise into the power supply of the component operating in the CML domain.

Thus, a differential level shifter that is configured to lower the signal swing of CMOS logic signals $I_1$, $I_2$ to thereby reduce the noise associated with the common mode signal $CM_1$ may be utilized for CMOS logic signals $I_1$, $I_2$ that are to be provided to components operating in the CML domain.

Figure 2:
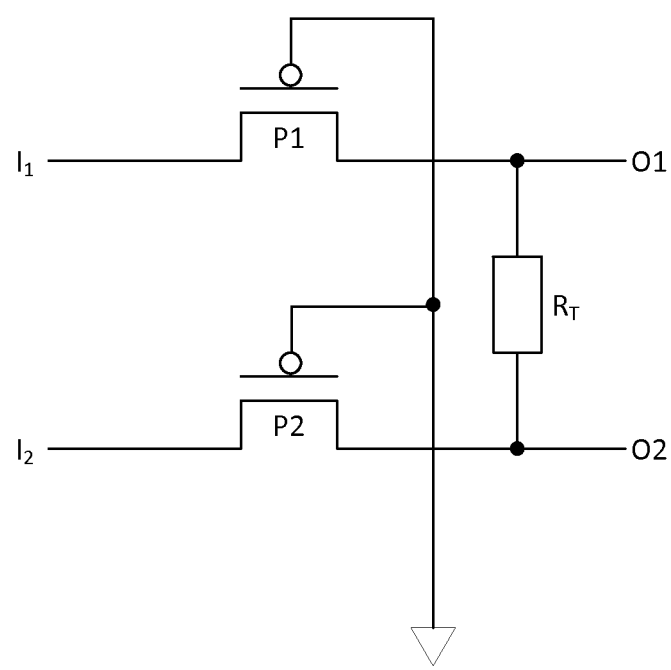
FIG. 2 illustrates a differential level shifter according to some embodiments.

FIG. 2 illustrates a differential level shifter 200 according to some embodiments. The differential level shifter 200 includes a first PMOS transistor P1, a second PMOS transistor P2, and a shift component. In the embodiment illustrated in FIG. 2, the shift component is a termination resistor $R_T$. However, the shift component may also take on other forms in other embodiments, as will be discussed in greater detail below.

A source/drain of the first PMOS transistor P1 is coupled to the first CMOS logic signal $I_1$, a gate of the first PMOS transistor P1 is coupled to the ground, and another source/drain of the first PMOS transistor P1 is coupled to a first output node O1. A source/drain of the second PMOS transistor P2 is coupled to the second CMOS logic signal $I_2$, a gate of the second PMOS transistor P2 is coupled to the ground, and another source/drain of the second PMOS transistor P2 is coupled to a second output node O2. The termination resistor $R_T$ (which may be an example of a shift component) is coupled between the first output node O1 and the second output node O2. It should be noted that for a MOS transistor, the source and drain are interchangeable. For a PMOS transistor, the source is the side with the highest potential and the drain is the side with the lowest potential, and as such current always flows from source to drain. The direction of current changes with the polarity of input signals (e.g., CMOS logic signals). One ordinarily skilled in the art will recognize that reference made to the source/drain will vary in accordance with the polarity of input signals.

Figure 4:
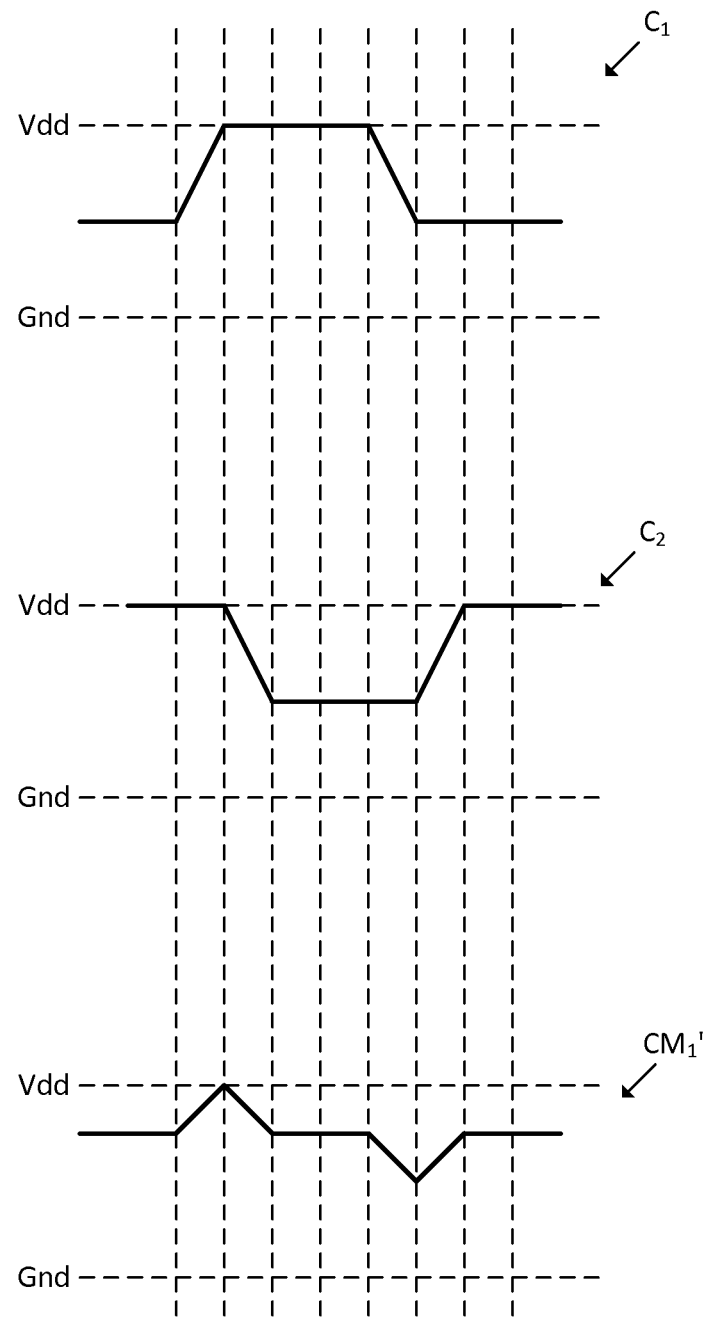
FIG. 4 illustrates a pair of output logic signals and their common mode signal according to some embodiments.

The differential shifter 200 is configured to receive a first CMOS logic signal $I_1$ (e.g., positive CMOS logic signal) at the source/drain of the first PMOS transistor P1 and a second CMOS logic signal $I_2$ (e.g., negative CMOS logic signal) at the source/drain of the second PMOS transistor P2. The differential shifter 200 is further configured to reduce the signal swing of the first and second CMOS logic signals $I_1$, $I_2$ to generate a first output logic signal at the first output node and a second output logic signal at the second output node. By reducing the signal swing of the first and second CMOS logic signals $I_1$, $I_2$ to generate the first and second output logic signals, a common mode signal associated with the first and second output logic signals will suffer from much less noise than the common mode signal associated with the first and second CMOS logic signals. FIG. 4 illustrates the first output logic signal $C_1$, the second output logic signal $C_2$, and the common mode signal $CM_1'$ that results from combining the first and second output logic signals generated by the differential level shifter 200.

Referring to FIGS. 2 and 4, the differential level shifter 200 reduces the signal swing associated with the first and second CMOS logic signals $I_1$, $I_2$ to generate first and second output logic signals $C_1$, $C_2$ by acting as a voltage divider between the first and second CMOS logic signals $I_1$, $I_2$. When the first CMOS logic signal $I_1$ is high (e.g., tied to Vdd) and the second CMOS logic signal is low (e.g., tied to Gnd), the first PMOS transistor P1 will operate in the linear region. As a result, the resistance associated with the first PMOS transistor P1 will be negligible and the voltage at the first output O1 will approximate the voltage at the drain of the first PMOS transistor P1. A voltage divider is then formed by the termination resistor $R_T$ and the second PMOS transistor P2. As the voltage at the second output O2 drops towards ground the second PMOS transistor P2 reaches an equilibrium where the drain-source voltage of the second PMOS transistor P2 is sufficient to conduct current.

Thus, the signal swing of the first and second output logic signals $C_1$, $C_2$ generated at the output nodes O1, O2 of the differential level shifter 200 will have a range between the power supply Vdd and a voltage level greater than ground Gnd. This in turn reduces the amount of noise for the common mode signal $CM_1'$ associated with the first and second output logic signals $C_1$, $C_2$. By passing the CMOS logic signals $I_1$, $I_2$ through the differential level shifter 200 to generate output logic signals $C_1$, $C_2$ with a shorter signal swing, rather than directly passing the CMOS logic signals $I_1$, $I_2$ to components operating in the CML domain, the amount of noise introduced into components operating in the CML domain may be greatly reduced.

As illustrated in FIG. 4, the signal swing of the first and second output logic signals $C_1$, $C_2$ at the output nodes O1, O2 of the differential level shifter 200 will have a range between the power supply Vdd and a voltage level greater than ground Gnd. The sizes of the PMOS transistors P1, P2 and termination resistor $R_T$ may be varied to set the appropriate signal swing for output logic signals $C_1$, $C_2$ generated at the output nodes O1, O2 of the differential level shifter 200. As already discussed above, because the signal swing of the output logic signals $C_1$, $C_2$ is smaller than the signal swing of the first and second CMOS logic signals $I_1$, $I_2$, the noise associated with the common mode signal $CM_1'$ generated by combining the first and second output logic signals $C_1$, $C_2$ will also be reduced as illustrated in FIG. 4.

Figure 3:
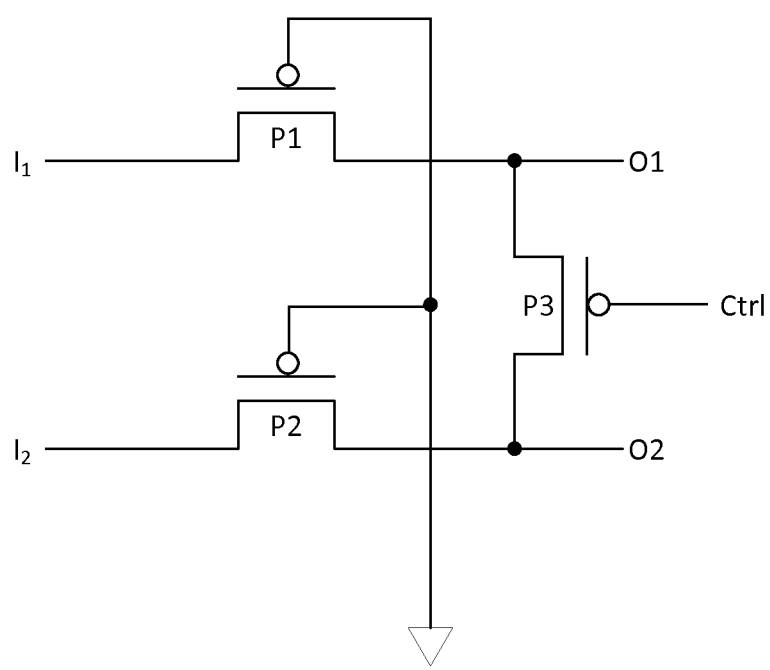
FIG. 3 illustrates a differential level shifter according to some other embodiments.

FIG. 3 illustrates a differential level shifter 300 according to other embodiments. The differential level shifter 300 includes a first PMOS transistor P1, a second PMOS transistor P2, and a shift component. The differential level shifter 300 of FIG. 3 operates in the same manner as the differential level shifter 200 of FIG. 2, but utilizes a third PMOS transistor P3 rather than a termination resistor $R_T$ as the shift component.

A source/drain of the first PMOS transistor P1 is coupled to the first CMOS logic signal $I_1$, a gate of the first PMOS transistor P1 is coupled to the ground, and another source/drain of the first PMOS transistor P1 is coupled to a first output node O1. A source/drain of the second PMOS transistor P2 is coupled to a second CMOS logic signal $I_2$, a gate of the second PMOS transistor P2 is coupled to the ground, and another source/drain of the second PMOS transistor P2 is coupled to a second output node O2. The third PMOS transistor P3 is coupled between the first output node O1 and the second output node O2. A source/drain of the third PMOS transistor P3 is coupled to the first output node O1, another source/drain of the third PMOS transistor P3 is coupled to the second output node O2 and a gate of the third PMOS transistor P3 is coupled to a control signal CTRL that configures the resistance of the third PMOS transistor P3. It should be noted that for a MOS transistor, the source and drain are interchangeable. For a PMOS transistor, the source is the side with the highest potential and the drain is the side with the lowest potential, and as such current always flows from source to drain. The direction of current changes with the polarity of input signals (e.g., CMOS logic signals). One ordinarily skilled in the art will recognize that reference made to the source/drain will vary in accordance with the polarity of input signals.

The differential shifter 300 is configured to receive the first CMOS logic signal $I_1$ (e.g., positive CMOS logic signal) at the source/drain of the first PMOS transistor P2 and the second CMOS logic signal $I_2$ (e.g., negative CMOS logic signal) at the source/drain of the second PMOS transistor P2. The differential shifter 300 is also configured to reduce the signal swing of the first and second CMOS logic signals $I_1$, $I_2$ to generate a first output logic signal at the first output node O1 and a second output logic signal at the second output node O2. By reducing the signal swing of the first and second CMOS logic $I_1$, $I_2$ signals to generate the first and second output logic signals, a common mode signal associated with the first and second output logic signals will suffer from much less noise than the common mode signal associated with the first and second CMOS logic signals. FIG. 4 illustrates the first output logic signal $C_1$, the second output logic signal $C_2$, and the common mode signal $CM_1'$ that results from combining the first and second output logic $C_1$, $C_2$ signals generated by the differential shifter 300.

The differential level shifter 300 reduces the signal swing associated with the first and second CMOS logic signals $I_1$, $I_2$ to generate first and second output logic signals $C_1$, $C_2$ by acting as a voltage divider between the first and second CMOS logic signals $I_1$, $I_2$. When the first CMOS logic signal $I_1$ is high (e.g., tied to Vdd) and the second CMOS logic signal $I_2$ is low (e.g., tied to Gnd), the first PMOS transistor P1 will operate in the linear region. As a result, the resistance associated with the first PMOS transistor P1 will be negligible and the voltage at the first output node O1 will approximate the voltage at the drain of the first PMOS transistor P1. A voltage divider is then formed by the third PMOS transistor P3 and the second PMOS transistor P2. The control signal CTRL coupled to the gate of the third PMOS transistor P3 is used to configure the resistance of the third PMOS transistor P3. As the voltage at the second output node O2 drops towards ground the second PMOS transistor P2 reaches an equilibrium where the drain-source voltage of the second PMOS transistor P2 is sufficient to conduct current.

Thus, the signal swing of the first and second output logic signals $C_1$, $C_2$ at the output nodes O1, O2 of the differential level shifter 300 will have a range between the power supply Vdd and a voltage level greater than ground Gnd. This in turn reduces the amount of noise for the common mode signal $CM_1'$ associated with the first and second output logic signals $C_1$, $C_2$. By passing the CMOS logic signals $I_1$, $I_2$ through the differential level shifter 300 to generate output logic signals $C_1$, $C_2$ with a shorter signal swing, rather than directly passing the CMOS logic signals $I_1$, $I_2$ to components operating in the CML domain, the amount of noise introduced into components operating in the CML domain may be greatly reduced.

The sizes of the PMOS transistors P1, P2, P3 may be varied to set the appropriate signal swing for output logic signals $C_1$, $C_2$ generated at the output nodes O1, O2 of the differential level shifter 300. As already discussed above, because the signal swing of the output logic signals $C_1$, $C_2$ is smaller than the signal swing of the first and second CMOS logic signals $I_1$, $I_2$, the noise associated with the common mode signal $CM_1'$ generated by combining the first and second output logic signals $C_1$, $C_2$ will also be reduced as illustrated in FIG. 4.

While the differential level shifters 200, 300 of FIGS. 2 and 3 reduce the signal swing of the CMOS logic signals $I_1$, $I_2$ to generate first and second output logic signals $C_1$, $C_2$ with a signal swing having a range between the power supply Vdd and a voltage level greater than ground Gnd, there may be situations where it is desirable to reduce the signal swing of CMOS logic signals such that the signal swing of the generated first and second output logic signals have a range between ground Gnd and a voltage level less than the power supply Vdd.

Figure 5:
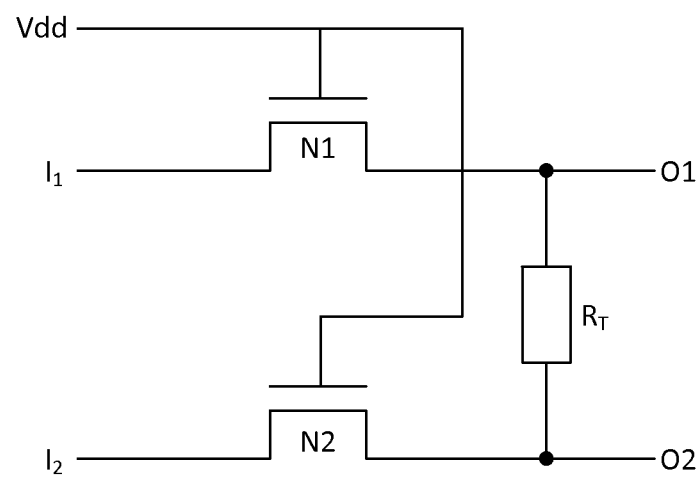
FIG. 5 illustrates a differential level shifter according to some other embodiments.

FIG. 5 illustrates a differential level shifter 500 according to other embodiments. In contrast to the differential level shifters 200, 300 of FIGS. 2 and 3, wherein the signal swing of the CMOS logic signals $I_1$, $I_2$ are reduced to generate the first and second output logic signals $C_1$, $C_2$ with a signal swing having a range between the power supply Vdd and a voltage level greater than ground Gnd, the differential level shifter 500 of FIG. 5 reduces the signal swing of the CMOS logic signals $I_1$, $I_2$ such that the signal swing of the first and second output logic signals have a range between ground and a voltage level less than the power supply Vdd. For purposes of example, the first and second CMOS logic signals being received by the differential level shifter 500 are those shown in FIG. 1.

The differential level shifter 500 of FIG. 5 includes a first NMOS transistor N1, a second NMOS transistor N2, and a shift component. In the embodiment illustrated in FIG. 5, the shift component is a termination resistor $R_T$. However, the shift component may also take on other forms in other embodiments, as will be discussed in greater detail below.

A source/drain of the first NMOS transistor N1 is coupled to the first CMOS logic signal $I_1$, a gate of the first NMOS transistor N1 is coupled to the power supply Vdd, and another source/drain of the first NMOS transistor N1 is coupled to a first output node O1. A source/drain of the second NMOS transistor N2 is coupled to the second CMOS logic signal $I_2$, a gate of the second NMOS transistor N2 is coupled to the power supply Vdd, and another source/drain of the second NMOS transistor N2 is coupled to a second output node O2. The termination resistor $R_T$ is coupled between the first output node O1 and the second output node O2. It is important to note that for a MOS transistor, the source and drain are interchangeable. For an NMOS transistor, the source is the side with the lowest potential and the drain is the side with the highest potential, and as such current always flows from drain to source. The direction of current changes with the polarity of input signals (e.g., CMOS logic signals). As such, one ordinarily skilled in the art will recognize that reference made to the source/drain will vary in accordance with the polarity of input signals.

Figure 7:
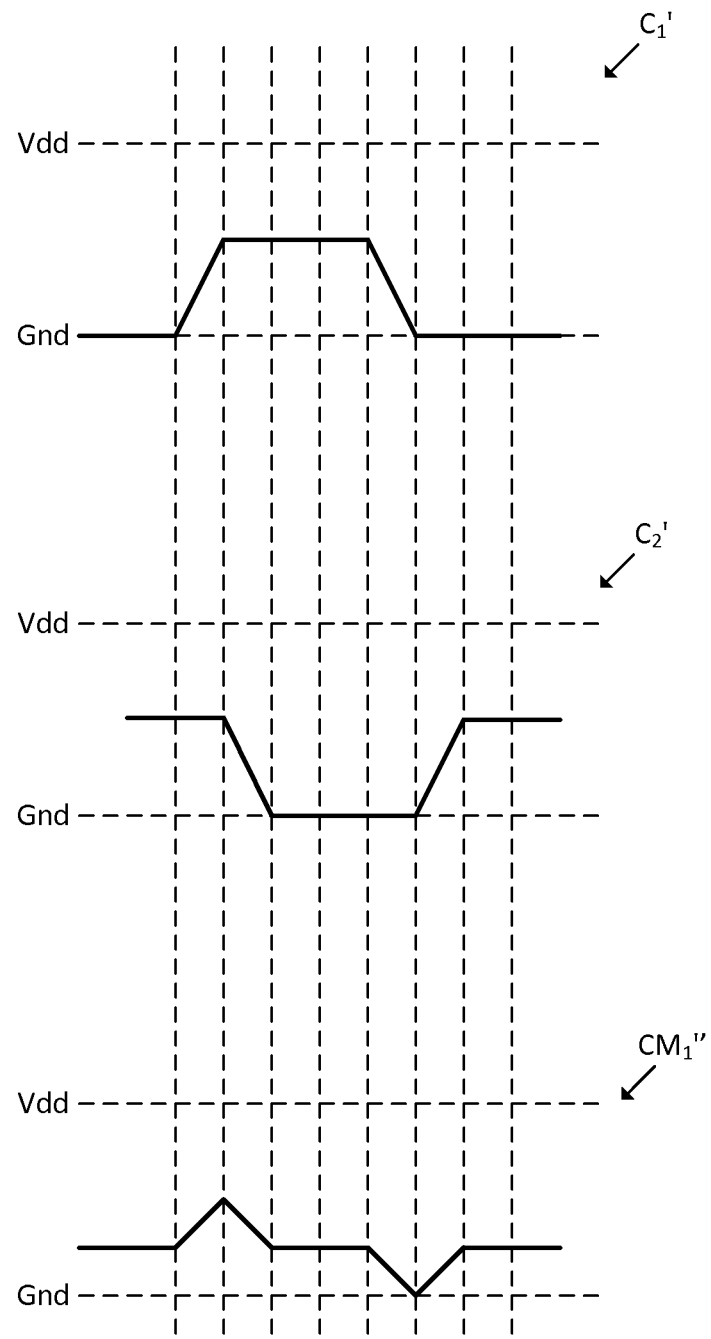
FIG. 7 illustrates a pair of output logic signals and their common mode signal according to some embodiments.

The differential shifter 500 is configured to receive the first CMOS logic signal $I_1$ (e.g., positive CMOS logic signal) at the source/drain of the first NMOS transistor N1 and the second CMOS logic signal $I_2$ (e.g., negative CMOS logic signal) at the source/drain of the second NMOS transistor N2. The differential shifter 500 is further configured to reduce the signal swing of the first and second CMOS logic signals $I_1$, $I_2$ to generate a first output logic signal at the first output node O1 and a second output logic signal at the second output node O2. By reducing the signal swing of the first and second CMOS logic signals $I_1$, $I_2$ to generate the first and second output logic signals, a common mode signal associated with the first and second output logic signals will suffer from much less noise than the common mode signal $CM_1$ associated with the first and second CMOS logic signals $I_1$, $I_2$. FIG. 7 illustrates the first output logic signal $C_1'$, the second output logic signal $C_2'$, and the common mode signal $CM_1''$ that results from combining the first and second output logic signals $C_1'$, $C_2'$ generated by the differential level shifter 500.

The differential level shifter 500 reduces the signal swing associated with the first and second CMOS logic signals $I_1$, $I_2$ to generate first and second output logic signals $C_1'$, $C_2'$ by acting as a voltage divider between the first and second CMOS logic signals $I_1$, $I_2$. When the second CMOS logic signal $I_2$ is low (e.g., tied to ground) and the first CMOS logic signal $I_1$ is high (e.g., tied to Vdd), the second NMOS transistor N2 will operate in the linear region. As a result, the resistance associated with the second NMOS transistor N2 will be negligible and the voltage at the second output node O2 will approximate the voltage at the drain of the second NMOS transistor N2. A voltage divider is then formed by the termination resistor $R_T$ and the first NMOS transistor N1. As the voltage at the first output O1 rises towards the power supply Vdd, the first NMOS transistor N1 reaches an equilibrium where the drain-source voltage of the first NMOS transistor N1 is sufficient to conduct current.

Thus, the signal swing of the first and second output logic signals $C_1'$, $C_2'$ at the output nodes O1, O2 of the differential level shifter 500 will have a range between ground Gnd and a voltage level less than the power supply Vdd. This in turn reduces the amount of noise for the common mode signal $CM_1''$ associated with the first and second output logic signals $C_1'$, $C_2'$. By passing the CMOS logic signals $I_1$, $I_2$ through the differential level shifter 500 to generate output logic signals $C_1'$, $C_2'$ with a shorter signal swing, rather than directly passing the CMOS logic signals $I_1$, $I_2$ to components operating in the CML domain, the amount of noise introduced into components operating in the CML domain may be greatly reduced.

As illustrated in FIG. 7, the signal swing of the first and second output logic signals $C_1'$, $C_2'$ at the output nodes O1, O2 of the differential level shifter 500 will have a range between ground Gnd and a voltage level less than the power supply Vdd. The sizes of the NMOS transistors N1, N2 and termination resistor $R_T$ may be varied to set the appropriate signal swing for output logic signals $C_1'$, $C_2'$ generated at the output nodes O1, O2 of the differential level shifter 500. As discussed above, because the signal swing of the output logic signals $C_1'$, $C_2'$ is smaller than the signal swing of the first and second CMOS logic signals $I_1$, $I_2$, the noise associated with the common mode signal $CM_1'$ generated by combining the first and second output logic signals $C_1'$, $C_2'$ will also be reduced as illustrated in FIG. 7.

Figure 6:
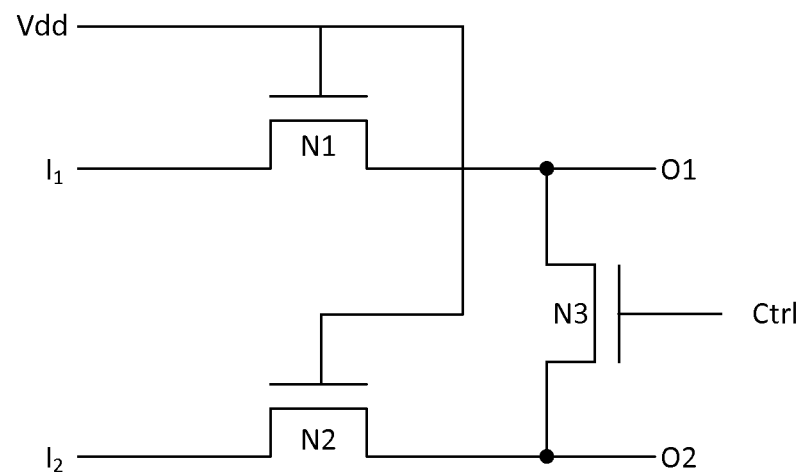
FIG. 6 illustrates a differential level shifter according to some other embodiments.

FIG. 6 illustrates a differential level shifter 600 according to some other embodiments. The differential level shifter 600 includes a first NMOS transistor N1, a second NMOS transistor N2, and a shift component. The differential level shifter 600 of FIG. 6 operates in the same manner as the differential level shifter 500 of FIG. 5, but utilizes a third NMOS transistor N3 rather than a termination resistor $R_T$ as the shift component.

The differential level shifter 600 of FIG. 6 includes a first NMOS transistor N1, a second NMOS transistor N2, and a shift component. In the embodiment illustrated in FIG. 6, the shift component is a third NMOS transistor N3.

A source/drain of the first NMOS transistor N1 is coupled to the first CMOS logic signal $I_1$, a gate of the first NMOS transistor N1 is coupled to the power supply Vdd, and another source/drain of the first NMOS transistor N1 is coupled to a first output node O1. A source/drain of the second NMOS transistor N2 is coupled to the second CMOS logic signal $I_2$, a gate of the second NMOS transistor N2 is coupled to the power supply Vdd, and another source/drain of the second NMOS transistor N2 is coupled to a second output node O2. The third NMOS transistor N3 is coupled between the first output node O1 and the second output node O2. A source/ drain of the third NMOS transistor N3 is coupled to the first output node O1, another source/drain of the third NMOS transistor N3 is coupled to the second output node O2 and a gate of the third NMOS transistor N3 is coupled to a control signal CTRL that configures the resistance of the third NMOS transistor N3. It is important to note that for a MOS transistor, the source and drain are interchangeable. For an NMOS transistor, the source is the side with the lowest potential and the drain is the side with the highest potential, and as such current always flows from drain to source. The direction of current changes with the polarity of input signals (e.g., CMOS logic signals). As such, one ordinarily skilled in the art will recognize that reference made to the source/drain will vary in accordance with the polarity of input signals.

The differential shifter 600 is configured to receive the first CMOS logic signal $I_1$ (e.g., positive CMOS logic signal) at the source/drain of the first NMOS transistor N1 and the second CMOS logic signal $I_2$ (e.g., negative CMOS logic signal) at the source/drain of the second NMOS transistor N2. The differential shifter 600 is further configured to reduce the signal swing of the first and second CMOS logic signals $I_1$, $I_2$ to generate a first output logic signal at the first output node O1 and a second output logic signal at the second output node O2. By reducing the signal swing of the first and second CMOS logic signals $I_1$, $I_2$ to generate the first and second output logic signals, a common mode signal associated with the first and second output logic signals will suffer from much less noise than the common mode signal $CM_1$ associated with the first and second CMOS logic signals $I_1$, $I_2$. FIG. 7 illustrates the first output logic signal $C_1'$, the second output logic signal $C_2'$, and the common mode signal $CM_1''$ that results from combining the first and second output logic signals $C_1'$, $C_2'$ generated by the differential level shifter 600.

The differential level shifter 600 reduces the signal swing associated with the first and second CMOS logic signals $I_1$, $I_2$ to generate first and second output logic signals $C_1'$, $C_2'$ by acting as a voltage divider between the first and second CMOS logic signals $I_1$, $I_2$. When the second CMOS logic signal $I_2$ is low (e.g., tied to ground) and the first CMOS logic signal $I_1$ is high (e.g., tied to Vdd), the second NMOS transistor N2 will operate in the linear region. As a result, the resistance associated with the second NMOS transistor N2 will be negligible and the voltage at the second output node O2 will approximate the voltage at the drain of the second NMOS transistor N2. A voltage divider is then formed by the third NMOS transistor N3 and the first NMOS transistor N1. As the voltage at the first output O1 rises towards the power supply Vdd, the first NMOS transistor N1 reaches an equilibrium where the drain-source voltage of the first NMOS transistor N1 is sufficient to conduct current.

Thus, the signal swing of the first and second output logic signals $C_1'$, $C_2'$ at the output nodes O1, O2 of the differential level shifter 600 will have a range between ground Gnd and a voltage level less than the power supply Vdd. This in turn reduces the amount of noise for the common mode signal $CM_1''$ associated with the first and second output logic signals $C_1'$, $C_2'$. By passing the CMOS logic signals $I_1$, $I_2$ through the differential level shifter 600 to generate output logic signals $C_1'$, $C_2'$ with a shorter signal swing, rather than directly passing the CMOS logic signals $I_1$, $I_2$ to components operating in the CML domain, the amount of noise introduced into components operating in the CML domain may be greatly reduced.

As illustrated in FIG. 7, the signal swing of the first and second output logic signals $C_1'$, $C_2'$ at the output nodes O1, O2 of the differential level shifter 600 will have a range between ground Gnd and a voltage level less than the power supply Vdd. The sizes of the NMOS transistors N1, N2, N3 may be varied to set the appropriate signal swing for output logic signals $C_1'$, $C_2'$ generated at the output nodes O1, O2 of the differential level shifter 600. As discussed above, because the signal swing of the output logic signals $C_1'$, $C_2'$ is smaller than the signal swing of the first and second CMOS logic signals $I_1$, $I_2$, the noise associated with the common mode signal $CM_1'$ generated by combining the first and second output logic signals $C_1'$, $C_2'$ will also be reduced as illustrated in FIG. 7.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and alternatives.

What is claimed is:

1. A differential level shifter, comprising:
   a first PMOS transistor, wherein a source/drain of the first PMOS transistor is coupled to a first CMOS signal, a gate of the first PMOS transistor is coupled to ground, and another source/drain of the first PMOS transistor is coupled to a first output node;
   a second PMOS transistor, wherein a source/drain of the second PMOS transistor is coupled to a second CMOS signal, a gate of the second PMOS transistor is coupled to ground, and another source/drain of the second PMOS transistor is coupled to a second output node; and
   a shift component coupled between the first output node and the second output node
   wherein the first and second PMOS transistors and the shift component are configured to convert the first and second CMOS signals into first and second output signals, the first and second output signals each having a signal swing that ranges from a power supply voltage to a voltage level greater than ground; and
   wherein the first CMOS signal ranges from a first value to a second value, and wherein the differential level shifter is configured to adjust only one of the first and second values to obtain the first output signal.

2. The differential level shifter of claim 1, wherein the first CMOS signal is a positive CMOS signal and the second CMOS signal is a negative CMOS signal.

3. The differential level shifter of claim 2, wherein the negative CMOS signal is generated by inverting the positive CMOS signal.

4. The differential level shifter of claim 1, wherein the first CMOS signal and the second CMOS signal have timing differences.

5. The differential level shifter of claim 1, wherein the shift component comprises a resistor.

6. The differential level shifter of claim 1, wherein the shift component comprises a third PMOS transistor, a source/drain of the third PMOS transistor being coupled to the first output node, another source/drain of the third PMOS transistor being coupled to the second output node, and a gate of the third PMOS transistor being coupled to a control signal that configures a resistance of the third PMOS transistor.

7. The differential level shifter of claim 1, wherein the first output node is configured to provide the first output signal, and the second output node is configured to provide the second output signal.

8. The differential level shifter of claim 1, wherein the differential level shifter is configured to reduce common mode noise associated with the first and second CMOS signals.

9. A differential level shifter, comprising:
  a first NMOS transistor, wherein a source/drain of the first NMOS transistor is coupled to a first CMOS signal, a gate of the first NMOS transistor is coupled to a power supply, and another source/drain of the first NMOS transistor is coupled to a first output node;
  a second NMOS transistor, wherein a source/drain of the second NMOS transistor is coupled to a second CMOS signal, a gate of the second NMOS transistor is coupled to the power supply, and another source/drain of the second NMOS transistor is coupled to a second output node; and
  a shift component coupled between the first output node and the second output node;
  wherein the first and second NMOS transistors and the shift component are configured to convert the first and second CMOS signals into first and second output signals, the first and second output signals each having a signal swing that ranges from ground to a voltage level less than a power supply voltage; and
  wherein the first CMOS signal ranges from a first value to a second value, and wherein the differential level shifter is configured to adjust only one of the first and second values to obtain the first output signal.

10. The differential level shifter of claim 9, wherein the first CMOS signal is a positive CMOS signal and the second CMOS signal is a negative CMOS signal.

11. The differential level shifter of claim 10, wherein the negative CMOS signal is generated by inverting the positive CMOS signal.

12. The differential level shifter of claim 9, wherein the first CMOS signal and the second CMOS signal have timing differences.

13. The differential level shifter of claim 9, wherein the shift component comprises a resistor.

14. The differential level shifter of claim 9, wherein the shift component comprises a third NMOS transistor, a source/drain of the third NMOS transistor being coupled to the first output node, another source/drain of the third NMOS transistor being coupled to the second output node, and a gate of the third NMOS transistor being coupled to a control signal that configures a resistance of the third NMOS transistor.

15. The differential level shifter of claim 9, wherein the differential level shifter is configured to reduce common mode noise associated with the first and second CMOS signals.

16. A method for reducing noise associated with a common mode signal, comprising:
  receiving a first CMOS signal at an input of a first MOS transistor;
  receiving a second CMOS signal at an input of a second MOS transistor;
  reducing a first signal swing associated with the first CMOS signal to provide a first output signal at an output of the first MOS transistor by utilizing a first voltage divider formed by the first MOS transistor and a shift component coupled to the output of the first MOS transistor; and
  reducing a second signal swing associated with the second CMOS signal to provide a second output signal at an output of the second MOS transistor by utilizing a second voltage divider formed by the second MOS transistor and the shift component, wherein the shift component is coupled to the output of the second MOS transistor;
  wherein the first CMOS signal ranges from a first value to a second value, and wherein only one of the first and second values is adjusted to obtain the first output signal;
  the first output signal and the second output signal each having a signal swing that ranges from a power supply voltage to a voltage level greater than ground, or from the ground to a voltage level less than the power supply.

* * * * *